(12) United States Patent
De Jager

(10) Patent No.: US 6,989,886 B2
(45) Date of Patent: Jan. 24, 2006

(54) LITHOGRAPHIC APPARATUS AND DEVICE MANUFACTURING METHOD

(75) Inventor: Pieter Willem Herman De Jager, Rotterdam (NL)

(73) Assignee: ASML Netherlands B.V., Veldhoven (NL)

( * ) Notice: Subject to any disclaimer, the term of this patent is extended or adjusted under 35 U.S.C. 154(b) by 30 days.

(21) Appl. No.: 10/862,881

(22) Filed: Jun. 8, 2004

(65) Prior Publication Data

US 2005/0270512 A1  Dec. 8, 2005

(51) Int. Cl.
*G03B 27/54* (2006.01)
*G03B 27/42* (2006.01)
*G03B 27/72* (2006.01)
*G03B 27/32* (2006.01)
*G03C 5/00* (2006.01)

(52) U.S. Cl. .............................. 355/67; 355/53; 355/71; 355/77; 430/322

(58) Field of Classification Search .................. 355/53, 355/67, 71, 77; 430/5, 322; 359/558, 563, 359/564
See application file for complete search history.

(56) References Cited

U.S. PATENT DOCUMENTS

| | | |
|---|---|---|
| 5,500,736 A | 3/1996 | Koitabashi et al. |
| 5,523,193 A | 6/1996 | Nelson |
| 5,530,482 A | 6/1996 | Gove et al. |
| 5,579,147 A | 11/1996 | Mori et al. |
| 5,677,703 A | 10/1997 | Bhuva et al. |
| 5,808,797 A | 9/1998 | Bloom et al. |
| 5,982,553 A | 11/1999 | Bloom et al. |
| 6,133,986 A | 10/2000 | Johnson |
| 6,177,980 B1 | 1/2001 | Johnson |
| 6,687,041 B1 | 2/2004 | Sandstrom |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 2004/0041104 A1 | 3/2004 | Liebregts et al. |
| 2004/0130561 A1 | 7/2004 | Jain |
| 2004/0161678 A1 * | 8/2004 | Misaka .......................... 430/5 |

FOREIGN PATENT DOCUMENTS

EP  1 482 375 A2  12/2004

* cited by examiner

*Primary Examiner*—Alan Mathews
(74) *Attorney, Agent, or Firm*—Sterne, Kessler, Goldstein & Fox P.L.L.C.

(57) ABSTRACT

A lithographic apparatus comprises an illumination system that supplies a projection beam of radiation, which is patterned using a patterning system. A projection system projects the patterned beam along a predetermined beam path onto a target portion of a substrate. The projection system comprises an array of lenses located such that each lens directs a respective portion of the patterned beam towards a respective part of the target portion of the substrate. The projection system also comprises a series of lens components spaced apart along the beam path between the patterning system and the array of lenses. The lens components are dimensioned to collect at least third order diffraction components of the patterned beam.

9 Claims, 6 Drawing Sheets

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., comprising part of one or several dies) on a substrate (e.g., a silicon wafer, flexible substrate, or glass plate) that has a layer of radiation-sensitive material (e.g., resist). Instead of a mask, the patterning means may comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the projection beam in a given direction (the "scanning" direction), while synchronously scanning the substrate parallel or anti-parallel to this direction.

It will be appreciated that, whether or not a lithographic apparatus operates in stepping or scanning mode, it is vital that the patterned beam is directed onto the appropriate target portion of the substrate surface. In many circumstances multi-layer structures are built up on the surface of the substrate as a result of a sequence of lithographic processing steps. It is of course vital that the successive layers formed in the substrate are correctly in register with each other. Thus, great care is taken to ensure that the position of the substrate relative to the beam projection system is accurately known.

Diffraction effects can cause problems in lithographic apparatus as the patterned beam is not a simple reproduction of a pattern-imparting device, such as a mask or array of controllable elements, but rather is the resultant of a series of diffraction components propagating from the pattern-imparting device. For example, a projection beam propagating from a mask made up of a series of slits of equal width separated by opaque strips of equal width to the slits will be the sum of a series of odd-number diffraction components. The first order components alone will produce a sine wave intensity pattern rather than the square wave, which would result in the absence of any diffraction effects. The greater the number of components collected by the optical system, the closer the resultant intensity pattern will be to the square wave. In practice, however, in many lithographic systems adequate results can be achieved relying only on the first order components because of a "threshold" effect.

The threshold effect arises in lithographic apparatus that is used to expose resists that are fully converted chemically if exposed to light above a predetermined threshold intensity, but are not chemically converted to a significant extent if exposed below that threshold. In the case of the mask discussed above, if only first order components are collected all that is required is that the "sine wave" equivalent of the "square wave" pattern delivers the appropriate threshold exposure across the target region of the substrate. Some overlap of low intensity components of the projection beam outside the target region will not cause the resist outside the target region to be developed. It is therefore conventional practice to provide illumination systems in lithographic apparatus that collect only first order diffraction components from the patterning system. This has the considerable advantage of reducing the required size of lens components in the illumination system.

In microlens array (MLA) imaging systems, a projection system is provided which includes an array of lenses arranged such that each lens in the array projects a respective beam of light towards a substrate to be exposed. Individual beams delivered to respective lenses of the microlens array by a beam expander are directed towards respective parts of the substrate. The lenses of the array may focus the individual beams directly on the substrate, or may direct the beams towards the substrate through a further projection system located between the array and the substrate. The individual beams may be generated by a patterning device made up of, for example, an array of mirrors with one or more of the mirrors being positioned so as to reflect radiation to a respective lens of the array. The patterning device inevitably has a periodic physical structure, and this periodic structure will cause the generation of diffraction components. Conventionally, however, higher order diffraction components had not been thought significant in MLA imaging systems, and it has been thought sufficient to collect at most only first order diffraction components from the patterning device.

Problems have been encountered with such MLA systems with the appearance of "ghost" patterns of exposure, indicating the delivery to one lens of the array of a part of the projection beam intended for another lens, but these problems have been attributed to either misalignment between the projection beam and the lens array or optical aberrations in the illumination system.

Therefore, what is need is a system and method that reduce ghosting effects when a microlens array is utilized in a lithography tool.

SUMMARY OF THE INVENTION

According to one embodiment of the present invention, there is provided a lithographic apparatus comprising an illumination system for supplying a projection beam of radiation, a patterning system serving to impart to the projection beam a pattern in its cross section, a substrate table for supporting a substrate, and a projection system for projecting the patterned beam along a predetermined beam path onto a target portion of the substrate. The projection system comprises an array of lenses located such that each lens in the array is arranged to direct a respective portion of the patterned beam towards a respective part of the target portion of the substrate. The projection system further comprises a series of lens components spaced apart along the beam path between the patterning system and the lens array. The lens components are dimensioned to collect at least third order diffraction components of the projection beam from the patterning system.

Collection of the third order diffraction components originating from the smallest periodic structural features of the patterning system substantially reduces the intensity of components of the projection beam that reach the "wrong" lens of the microlens array. Thus, ghosting effects are materially reduced. Fifth order components or even twenty-ninth order components may be collected with lens components of practical dimensions to further reduce ghosting effects.

According to another embodiment of the present invention, there is provided a device manufacturing method comprising providing a substrate, projecting a projection beam of radiation using an illumination system, imparting to the projection beam a pattern in its cross section, supporting the substrate on a substrate table, and projecting the patterned beam along a predetermined beam path onto the target portion of the substrate through a projection system. The projection system comprises an array of lenses located such that each lens in the array is arranged to direct a respective portion of the patterned beam towards a respective part of the target portion of the substrate. At least third order diffraction components of the projection beam from the patterning system are collected by lens components of the projection system, which are spaced apart along the beam path between the patterning system and the lens array.

In one example, to systems in which the array of lenses focuses spots of light directly on the substrate.

In one example, the present invention is applicable to systems in which the array of lenses forms a series of source images that are projected onto the substrate by a projection subsystem located between the array and the substrate.

In one example, the present invention is applicable in lithographic apparatus relying upon arrays of individually controllable elements to impart a pattern to the projected beam and to devices using simple reticles (e.g., masks) to impart a desired pattern.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 2:
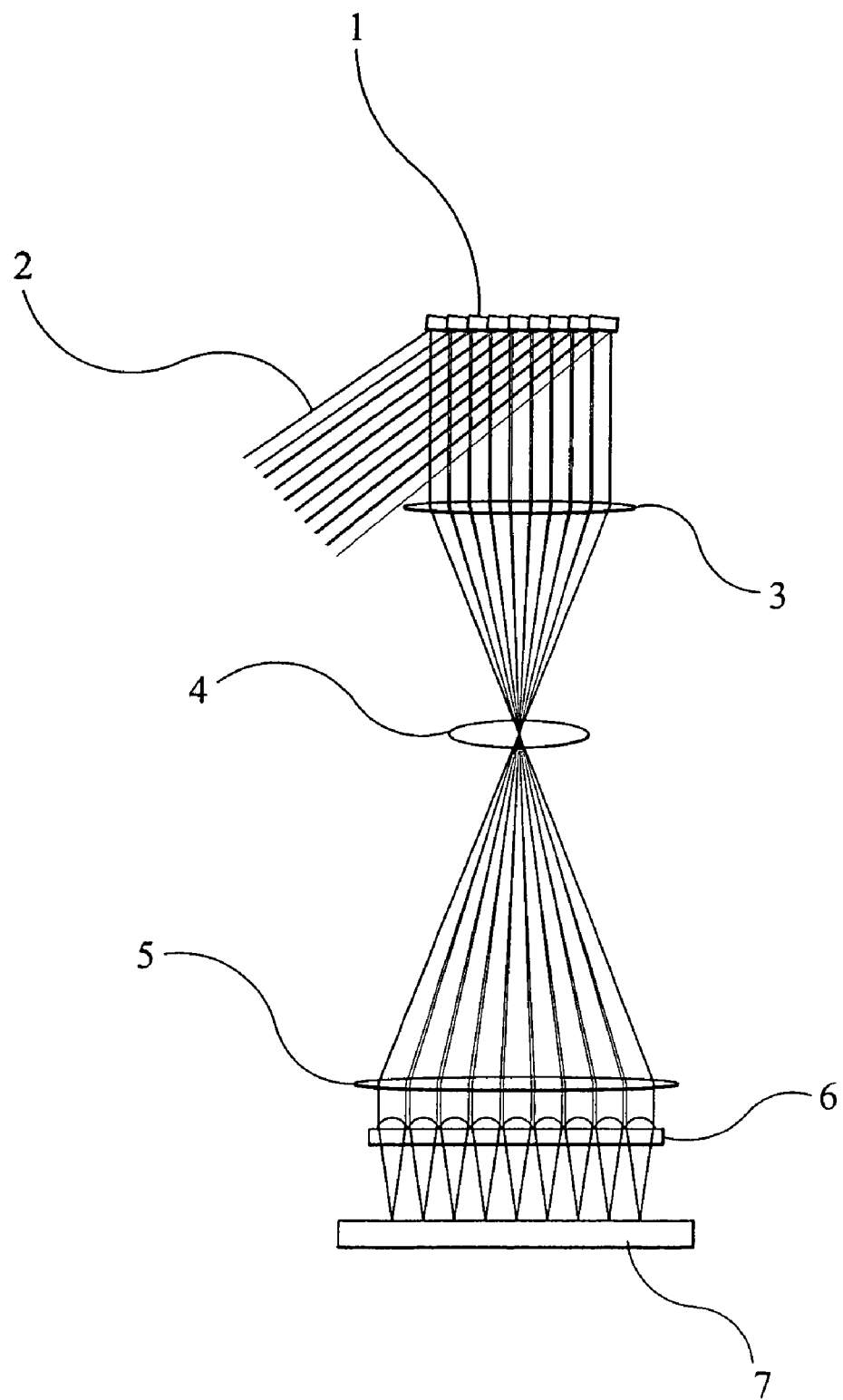
FIG. 2 depicts a lithographic apparatus, according to one embodiment of the present invention.
Figure 3:
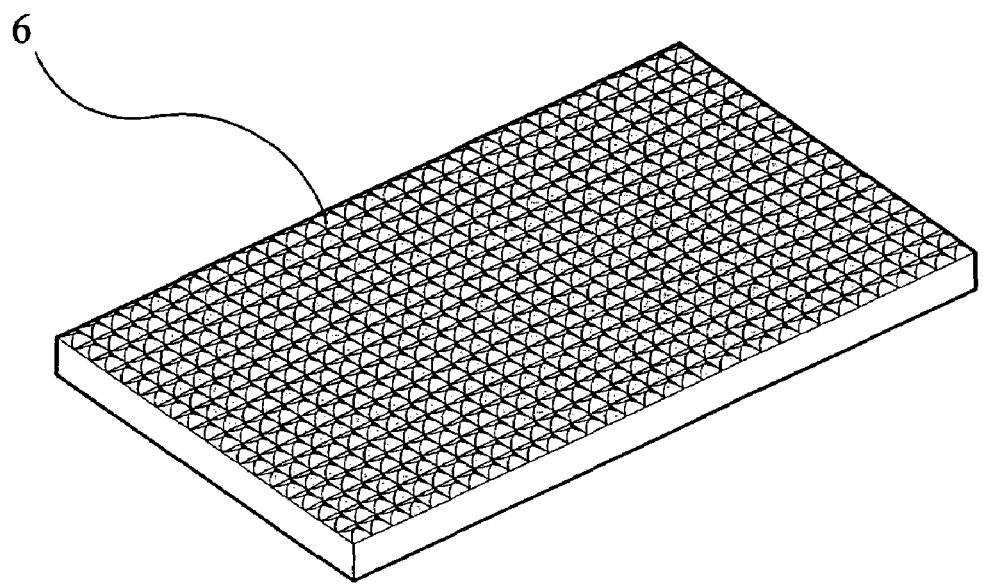

FIG. 3 schematically represents a microlens array incorporated in the apparatus of FIG. 2, according to one embodiment of the present invention.

Figure 4:
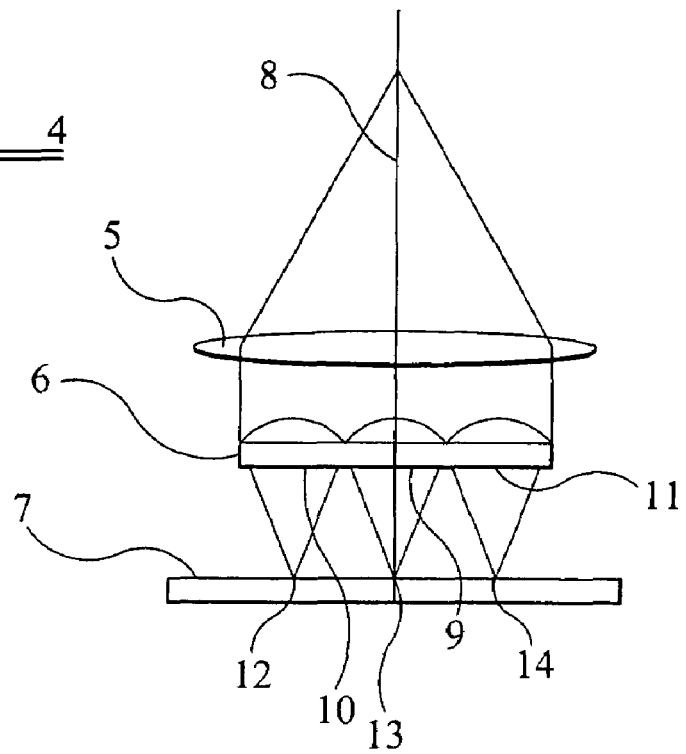

FIG. 4 schematically represents how three lenses of the array of FIG. 3 focus a radiation beam onto a substrate, according to one embodiment of the present invention.

Figure 5:
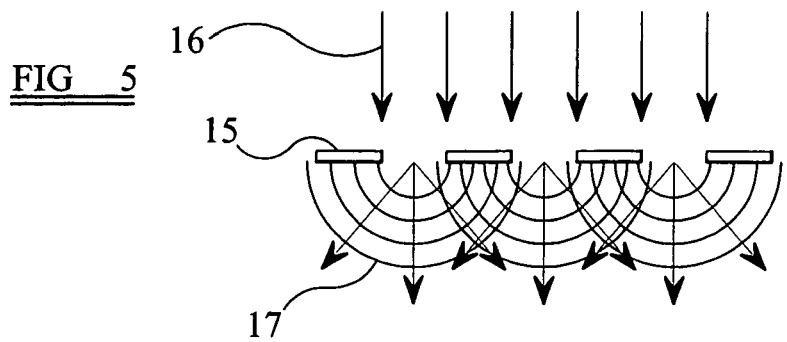

FIG. 5 is a schematic illustration of wavefronts propagating from a periodic grating, according to one embodiment of the present invention.

Figure 6:
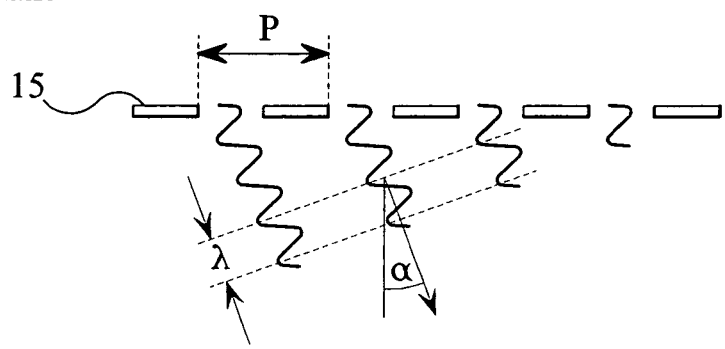

FIG. 6 is a schematic representation of a diffraction order generated by the grating of FIG. 5, according to one embodiment of the present invention.

Figure 7:
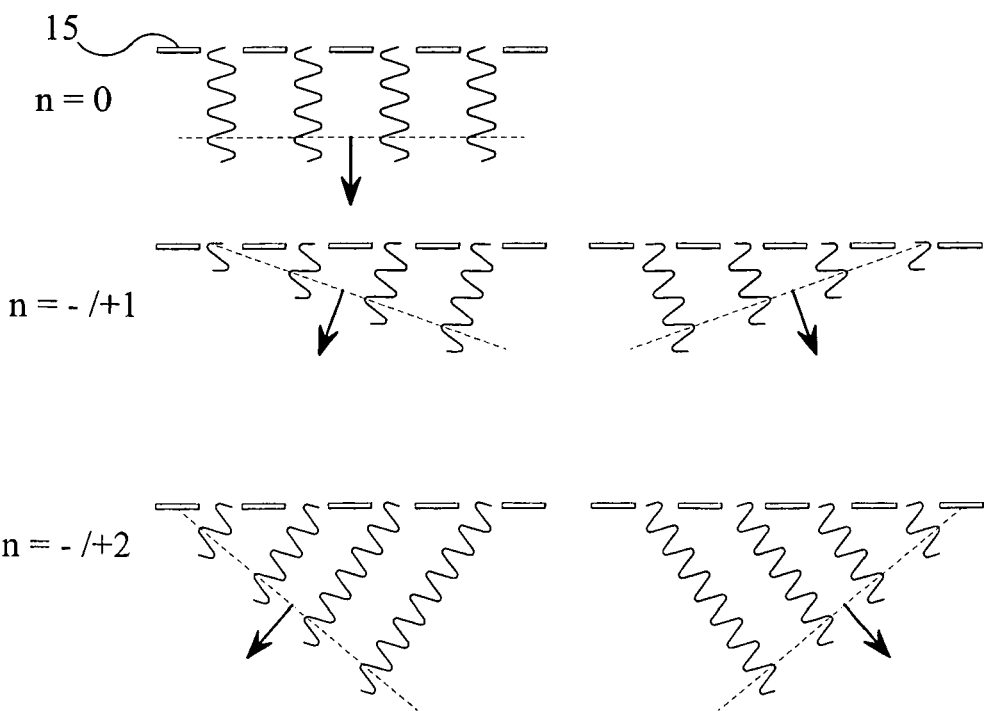

FIG. 7 is a schematic representation of three different diffraction orders generated by the grating of FIG. 5, according to one embodiment of the present invention.

Figure 8:
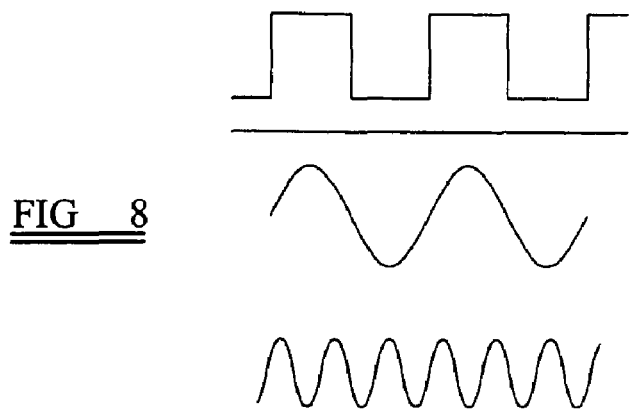

FIG. 8 shows four waveforms representative of the structure of the grating of FIG. 5 and three diffraction orders generated by that grating, according to one embodiment of the present invention.

Figure 9:
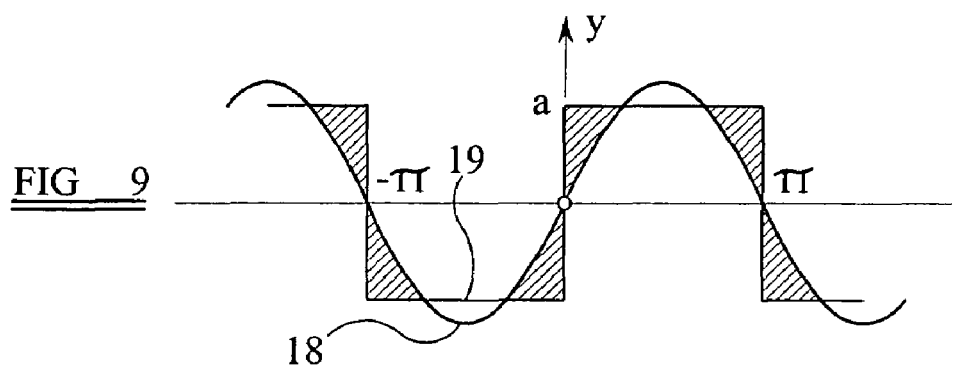

FIG. 9 is a schematic representation of the summation of the first two diffraction order waveforms shown in FIG. 8, according to one embodiment of the present invention.

Figure 10:
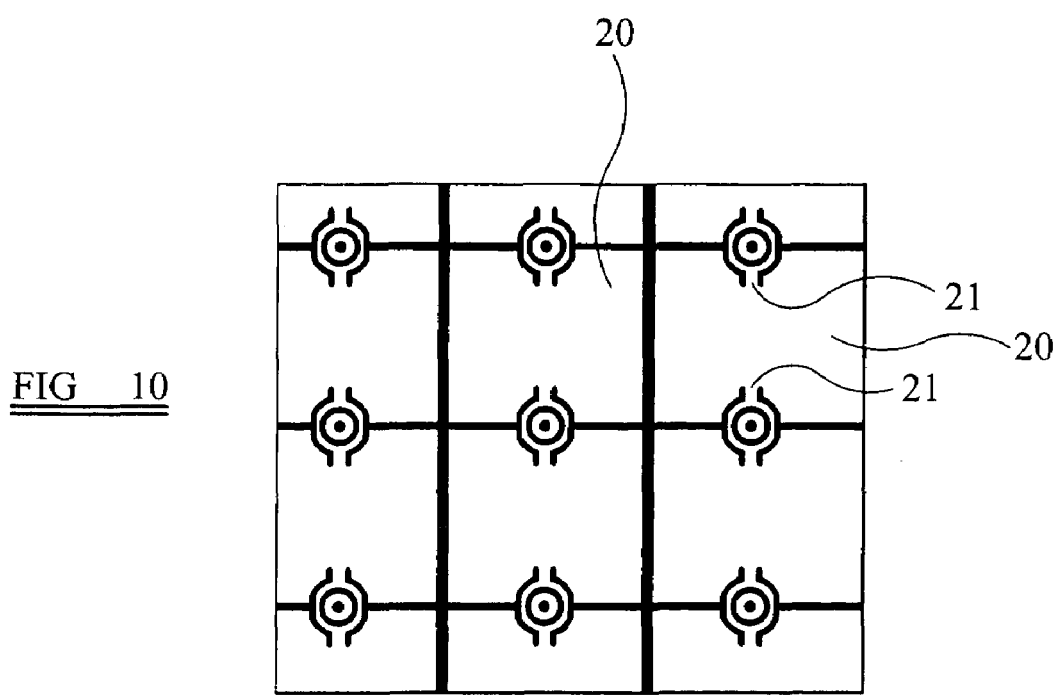

FIG. 10 is a schematic illustration of a control device incorporated in the embodiment of FIG. 2, according to one embodiment of the present invention.

Figure 11:
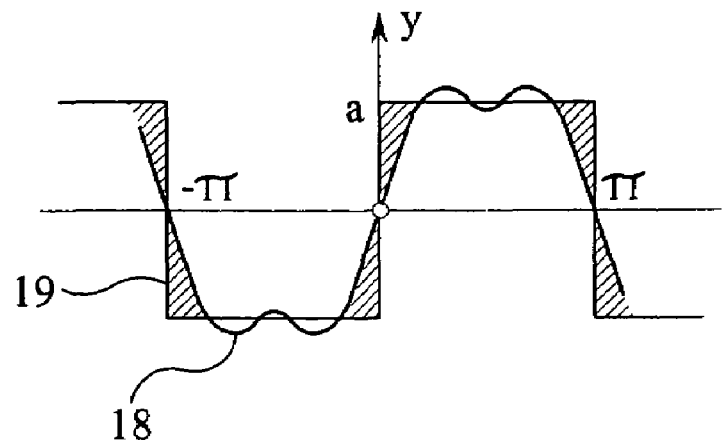
Figure 12:
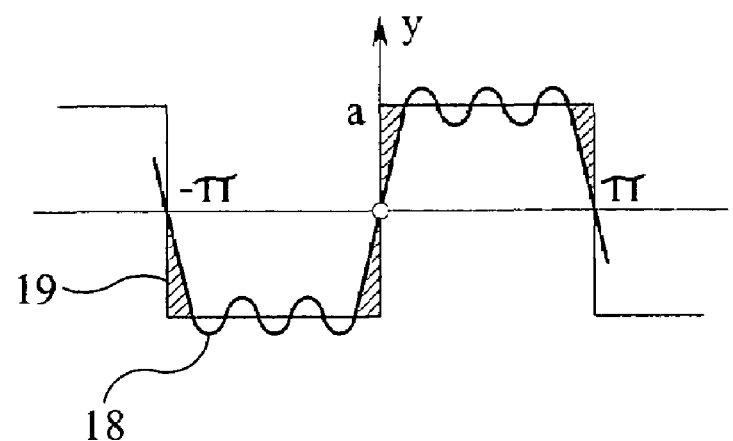
Figure 13:
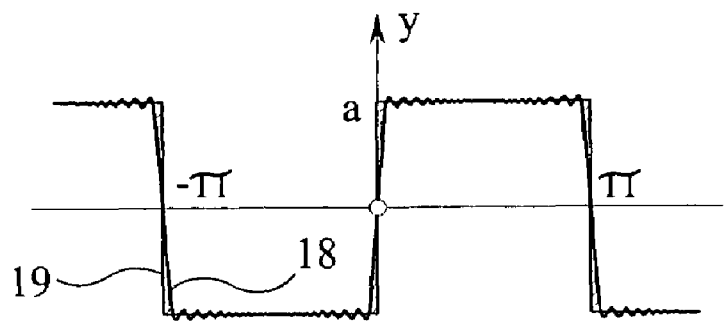

FIGS. 11, 12, and 13 are schematic representations of the summation of the first three, first five and first fifteen diffraction orders generated by the grating of FIG. 5, according to one embodiment of the present invention.

The present invention will now be described with reference to the accompanying drawings. In the drawings, like reference numbers may indicate identical or functionally similar elements.

DETAILED DESCRIPTION OF THE EMBODIMENTS

Overview and Terminology

In one embodiment of the present invention using a microlens array imaging system, it is the function of a field lens of a beam expander (which field lens may be formed from two or more separate lenses) in an illumination system to make a projection system telecentric by ensuring that all components of the light beam between the field lens and the microlens array are parallel and perpendicular to the microlens array. However, although light beams between the field lens and the microlens array may be substantially parallel, absolute parallelism may not be achievable.

Thus, given a degree of non-telecentricity in the projection system, according to one embodiment of the present invention, small magnification adjustments can be achieved without undue loss of focus by displacing one or more of the lens components which are located between the pupil and the substrate table.

In one embodiment, a projection system will define a pupil. The term "pupil" being used in this document to refer to a plane where rays of the projection beam intersect which rays leave the patterning system from different locations relative to the patterning system but at the same angle relative to an axis of the projection beam which is normal to the patterning system.

For example, according to one embodiment of the present invention, assuming a microlens imaging system in which the field lens is initially arranged to generate a perfectly parallel beam of radiation between itself and the array of lenses. Also, assume that light reaching the field lens is diverging. Any displacement of the field lens away from the microlens array will result in the projection beam becoming slightly divergent, whereas displacement of the field lens towards the microlens array will result in the projection beam becoming slightly convergent. Given however that the field lens is a relatively weak lens, displacements necessary to change the magnification of the projection system to compensate for distortions of the substrate (typically of the order of parts per million) can be achieved without affecting the focus of the projection beam on the substrate surface to an unacceptable extent. Although focus change due to displacement of the microlens array towards or away from the substrate is a first order effect, and resultant changes in magnification on a second order effect, nevertheless useful magnification adjustment may be made.

In this embodiment, the field lens may be made up of a single or two or more lenses. Each field lens may be simply moved in translation either towards or away from the microlens array, or the field lens may be tilted so as to result in a differential change in magnification across the surface of the exposed substrate. Similarly, the microlens array may be moved in translation and/or tilted.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array may comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Further, the apparatus may be provided with a fluid processing cell to allow interactions between a fluid and irradiated parts of the substrate (e.g., to selectively attach chemicals to the substrate or to selectively modify the surface structure of the substrate).

Lithographic Projection Apparatus

Figure 1:
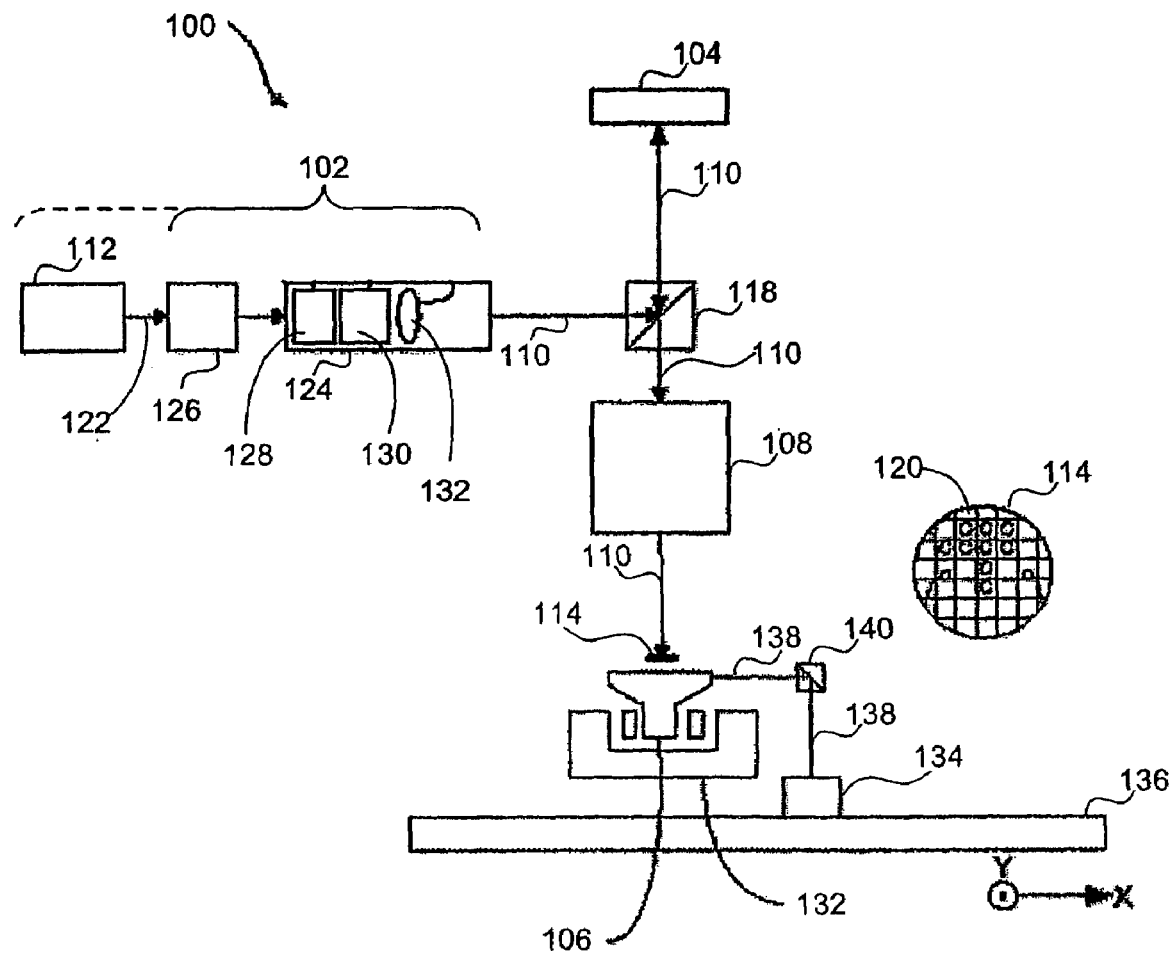
FIG. 1 depicts a lithographic apparatus in which the present invention can be practiced.

FIG. 1 schematically depicts a lithographic projection apparatus 100 in which the present invention can be practiced. Apparatus 100 includes at least a radiation system 102, an array of individually controllable elements 104, an object table 106 (e.g., a substrate table), and a projection system ("lens") 108.

Radiation system 102 can be used for supplying a projection beam 110 of radiation (e.g., UV radiation), which in this particular case also comprises a radiation source 112.

An array of individually controllable elements 104 (e.g., a programmable mirror array) can be used for applying a pattern to projection beam 110. In general, the position of the array of individually controllable elements 104 can be fixed relative to projection system 108. However, in an alternative arrangement, an array of individually controllable elements 104 may be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or CaF2 lens system or a catadioptric system comprising lens elements made from such materials, or a mirror system) can be used for projecting the patterned beam received from a beam splitter 118 onto a target portion 120 (e.g., one or more dies) of substrate 114. Projection system 108 may project an image of the array of individually controllable elements 104 onto substrate 114. Alternatively, projection system 108 may project images of secondary sources for which the elements of the array of individually controllable elements 104 act as shutters. Projection system 108 may also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander 126, for example. Illuminator 124 may comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, projection beam 110 impinging on the array of individually controllable elements 104 has a desired uniformity and intensity distribution in its cross section.

It should be noted, with regard to FIG. 1, that source 112 may be within the housing of lithographic projection apparatus 100 (as is often the case when source 112 is a mercury lamp, for example). In alternative embodiments, source 112 may also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directing using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 106 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system may also be used to position the array of individually controllable elements 104. It will be appreciated that projection beam 110 may alternatively/additionally be moveable, while object table 106 and/or the array of individually controllable elements 104 may have a fixed position to provide the required relative movement.

In an alternative configuration of the embodiment, substrate table 106 may be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 may be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 may be used to project a patterned projection beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned projection beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned projection beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned projection beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned projection beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned projection beam 110 scans across substrate 114 and exposes it.

Combinations and/or variations on the above described modes of use or entirely different modes of use may also be employed.

Exemplary Patterning of Projection Beam

FIG. 2 is a simplified schematic representation of one embodiment of the present invention. In this embodiment, a projection beam 2 is patterned using a contrast device 1. In this embodiment, contrast device 1 is in the form of a matrix of rows and columns of individually controllable mirrors. Projection beam 2 is directed towards contrast device 1 from an illumination source (not shown). Depending upon the orientation of the individual mirrors making up contrast device 1, light is either reflected towards a lens 3 or is reflected away from lens 3. Thus, a series of parallel beams of radiation are directed towards lens 3 by each of the elements in contrast device 1, which have the appropriate orientation.

Lens 3 causes the beams incident upon it to converge onto a further lens 4 which defines a pupil of an optical system. The pupil is a plane perpendicular to the optical path where rays intersect that leave the contrast device 1 from different locations, but with the same angle of inclination to contrast device 1. The beams incident on lens 4 are expanded to a field lens 5. The individual beams incident upon lens 5 are converted into substantially parallel beams, which are directed towards respective lenses of a microlens array 6. Microlens array 6 focuses the individual beams into an array of spots on the surface of a substrate 7. The surface of substrate 7 will be covered with a resist, which is to be selectively exposed by the spots of light focused on it by microlens array 6.

Exemplary Microlens Array

FIG. 3 illustrates a structure of microlens array 6 of FIG. 2, according to one embodiment of the present invention. FIG. 4 illustrates an exploded view of three individual lenses in microlens array 6, according to one embodiment of the present invention. A central optical axis is indicated by line 8. A beam of radiation is directed to a central lens 9, that beam being symmetrical about axis 8. Further beams are directed to individual lenses 10 and 11 to either side of axis 8. Each of these beams are focused to a respective spot 12, 13 and 14 by the respective lens 10, 9 and 11.

In the case illustrated in FIG. 2, contrast device 1 is provided to impart a pattern to the projection beam. A pattern could of course be imparted to the projection beam by a mask or reticle. In either case, diffraction effects will arise which will result in components of the projection beam propagating through the optical system in a variety of directions relative to the optical axis.

Pattern Generator Diffraction Characteristics

FIGS. 5 and 6 illustrate what will happen with a mask constructed so as to form a periodic grating.

In FIG. 5, the mask is constructed of opaque strips 15, where only four opaque strips 15 are shown for convenience. In this figure, the strips 15 extending perpendicular to a plane formed by the page. A projection beam 16 illuminates one side of the mask, and light propagates from the other side of the mask as indicated by the concentric semicircles 17.

FIG. 6 represents diffraction components travelling in one direction inclined at angle α to the plane of strips 15. Assuming that the periodic grating has a pitch P, the angle α is given by the following equation:

$$\sin \alpha = n \cdot \lambda / P$$

where n=the order of the diffraction component, n=0, 1, 2 . . . and λ is the wavelength of the projection beam.

The smaller the pitch, the greater the angles at which the diffraction components are inclined to the main optical axis. The longer the wavelength, the greater the angle of inclination, and the higher the order of the diffraction component the larger the angle. The higher orders are diffracted at larger angles of inclination to the projection axis.

FIG. 7 shows different diffraction orders. It can be seen that the n=0 orders propagate in the direction of the optical axis, the n=+1 or −1 order propagates at a first relatively small angle of inclination to the optical axis, the n=+2 or −2 orders propagate at a slightly larger angle to the optical axis, and so on with the angle of inclination increasing with order.

The n=0 order is a DC component, which is equal in amplitude to the average of the light and dark segments of the grating. If only the n=0 order is collected by the optical system, no image will be formed on the substrate. Accordingly, as is well known, at least the n=+/−1 orders must be collected by the optical system.

FIG. 8 shows intensity distribution graphs.

An uppermost line represents an intensity distribution at the mask or contrast device 1 assuming that the mask is a simple grating as shown in FIG. 7 with strips 15 and gaps between those strips of equal width, or a displaceable mirror device with each mirror being of the same size and there being no gaps between adjacent mirrors.

A second line counting downward represents a zero order uniform DC component.

A third line down represents a first order that has a first periodicity corresponding to the periodicity of the mask or contrast device. There is no second order component when there is a 50% duty cycle in the mask or contrast device.

A fourth line down represents a third order which has a periodicity three times that of the first order.

In the example shown in FIG. 8, only diffraction orders up to n=3 are collected. Given the 50% duty cycle of the mask or contrast device, there will be no even number orders, but there will be odd number (n=1, 3, 5, etc) orders with the periodicity being n times that of the first order.

FIG. 9 shows a graph. In the graph, line 18 represents a sum of the first and third orders shown in FIG. 8 and shows, for the purposes of comparison, by line 19 the difference between the sum of the first and third orders and the intensity distribution at the mask or contrast device. The ideal square wave represented by line 19 is very different from the actual intensity distribution represented by line 18.

In conventional lithographic apparatus where the intensity distribution represented by line 18 is delivered to, for example, a resist, appropriate exposures can still be achieved as the resist will have a threshold intensity level beneath which it will not be chemically converted by the exposure process and above which it will be chemically converted. Providing that threshold is approximately midway between the peaks of the intensity distribution represented by line 18, the appropriate exposure pattern will be achieved. It is because of this "threshold effect" that in conventional lithographic apparatus, where the full cross-section of the projection beam is focused onto the substrate surface through a single lens, it has been generally accepted not to be necessary to do more than collect the n=0 and n=±1 orders. Given that the degree to which diffraction orders are collected is a function of lens size, it has been thought advantageous to avoid the need for excessively large lenses by accepting collection of no more than the n=0 and n=±1 orders.

However, in the case of a projection system utilizing a microlens array, as in the example illustrated in FIG. 2, this "threshold effect" does not apply. This is because the effect of the diffraction components, such as represented by line 18 in FIG. 9, in regions which correspond to an "off" element of the pattern imparting device will not be negligible because of threshold effects.

The shaded portions of FIG. 9 between lines 18 and 19 represent light that will reach one of the lenses of the microlens array that ideally should receive no illumination at all. Any such light leaking into the "wrong" lens of the micro lens array will be focused to a completely different part of the substrate as compared to that which receives light from the "right" lens. As a result, "ghost" patterns will be delivered to the substrate surface at a considerable distance from that of the required pattern. Such ghost patterns can result in serious exposure misalignment problems.

Exemplary Patterning Device

The problem of ghost-pattern formation has been described above without reference to the detailed structure of the patterning device which imparts a pattern to the projection beam. There are, however, particular diffraction problems that arise in applications where the patterning means is a digital mirror array.

FIG. 10 illustrates a small part a patterning means that is a digital mirror array. The digital mirror array comprises a two-dimensional array of individual mirror elements 20 which are supported on flexible hinges 21. By the application of appropriate control voltages, mirror elements 20 can either be arranged to lie in the general plane of the array or can be tilted about hinges 21 so as to lie at an angle to the general plane of the array. Each individual mirror element 20 is relatively small, for example, but not limited to, 14 µm×14 µm, and hinges 21 are typically of the order of 1 µm wide. In one example, mirror elements 20 can be tilted through 11°. As a result of this geometry, the digital mirror array essentially forms a grating with a minimum feature dimension of the order of 1 µm. These features result in diffraction effects similar to those described with reference to FIGS. 5 to 9. Thus, substantial "ghost" patterns can result if only the first order diffraction components are collected by the optical system.

The number of orders collected by the optical system is a function of the size of the pupil of the optical projection system. Typically, in lithographic systems that have been proposed for use with contrast devices and lens arrays as illustrated in FIG. 2, the lens 4 will be very small, for example millimeters in diameter. Such dimensions result in only the n=±1 first order diffraction components being collected, resulting in serious "ghost" pattern effects.

In accordance with one embodiment of the present invention, the "ghost" effects are eliminated or substantially reduced. In this embodiment, this is accomplished by ensuring that the lens system is dimensioned to collect at least third order, and possibly higher order, diffraction components. Lens 4 of a system, such as that illustrated in FIG. 2, will be several centimeters rather than a few millimeters in diameter.

Representational Graphs of Reduced Ghost Effects Using Higher Order Diffracted Light Collection FIG. 11 illustrates the effect of collecting both the n=±1 and n=±3 diffraction components, according to one embodiment of the present invention. The shaded area between lines 18 and 19 is significantly reduced as compared with the shaded area between lines 18 and 19 in FIG. 9. Thus, "ghosting" effects are significantly reduced.

FIG. 12 shows the effect of collecting the n=±1, ±3 and ±5 components, according to one embodiment of the present invention. There is again a progressive reduction in the size of the shaded are a between lines 18 and 19.

FIG. 13 shows the effect of collecting all the diffraction components for n=±1 to ±29, according to one embodiment of the present invention.

In an example using a 50% duty cycle pattern, FIG. 13 represents the summation of fifteen different diffraction components. In an example using a patterning device that is not of the simple 50% duty cycle form, e.g., as illustrated in FIGS. 5 to 7, even number order components will contribute to the intensity distribution. This would be expected to occur if diffraction contributions arose from features such as those shown in the contrast device illustrated, by way of example and not limitation, in FIG. 10.

It will be appreciated that although the invention has been described in the context of a simplified optical system shown in FIG. 2, in practice there can generally be many lenses in the optical system and all of those lenses can be dimensioned so as to ensure collection of all the required diffraction orders.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithographic apparatus, comprising:
   an illumination system that supplies a projection beam of radiation;
   a patterning system that patterns the projection beam; and
   a projection system that projects the patterned beam along a predetermined beam path onto a target portion of a substrate, the projection system comprising,
      an array of lenses located such that each lens in the array of lenses directs a respective portion of the patterned beam towards a respective part of the target portion of the substrate, and
      a series of lens components spaced apart along the beam path between the patterning system and the array of lenses, wherein the series of lens components are dimensioned to collect at least third order diffraction components of the patterned beam.

2. The apparatus of claim 1, wherein the lens components are dimensioned to additionally collect at least fifth order components of the patterned beam.

3. The apparatus of claim 1, wherein the lens components are dimensioned to additionally collect at least twenty-ninth order components of the patterned beam.

4. The apparatus of claim 1, wherein the patterning system comprises an array of individually controllable elements.

5. A device manufacturing method, comprising:
    patterning a projection beam of radiation;
    projecting the patterned beam along a predetermined beam path onto a target portion of a substrate using an array of lenses in a projection system, such that each lens in the array of lenses directs a respective portion of the patterned beam towards a respective part of the target portion of the substrate; and
    collecting at least third order diffraction components of the patterned beam using lens components of the projection system.

6. The method of claim 5, further comprising spacing apart the lens components along the beam path between the patterning system and the array of lenses.

7. The method of claim 5, further comprising dimensioning the lens components to additionally collect at least fifth order components of the patterned beam.

8. The method of claim 5, further comprising dimensioning the lens components to additionally collect at least twenty-ninth order components of the patterned beam.

9. The method of claim 5, further comprising using an array of individually controllable elements as the patterning system.

* * * * *